United States Patent
Dougherty

(10) Patent No.: US 6,780,786 B2
(45) Date of Patent: Aug. 24, 2004

(54) METHOD FOR PRODUCING A POROUS SILICON FILM

(75) Inventor: George M. Dougherty, Albany, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/994,280

(22) Filed: Nov. 26, 2001

(65) Prior Publication Data

US 2003/0100136 A1 May 29, 2003

(51) Int. Cl.[7] .................. H01L 21/31; H01L 21/469
(52) U.S. Cl. .................. 438/758; 438/1; 438/22; 438/745; 210/321.84; 210/500.25; 156/625.1; 427/2.3; 427/167; 427/574; 427/719
(58) Field of Search .................. 438/1–4, 22–29, 438/758, 753, 764, 767, 694, 647, 657, 684, 719, 50–53; 210/321.84, 500.25, 500.26; 156/625.1; 427/2.3, 167, 255.27, 452, 563, 567, 574, 578, 588

(56) References Cited

U.S. PATENT DOCUMENTS

| | | | | |
|---|---|---|---|---|
| 4,498,226 A | * | 2/1985 | Inoue et al. | 29/576 B |
| 4,801,380 A | | 1/1989 | Parket et al. | 210/500.21 |
| 4,918,028 A | * | 4/1990 | Shirai | 437/81 |
| 4,942,058 A | * | 7/1990 | Sano | 427/431 |
| 5,198,379 A | * | 3/1993 | Adan | 437/41 |
| 5,213,997 A | * | 5/1993 | Ishihara et al. | 437/173 |
| 5,596,219 A | * | 1/1997 | Hierold | 257/467 |
| 5,651,900 A | | 7/1997 | Keller et al. | 216/56 |
| 5,789,753 A | * | 8/1998 | Gooch et al. | 250/349 |
| 5,830,372 A | * | 11/1998 | Hierold | 216/2 |
| 5,919,364 A | * | 7/1999 | Lebouitz et al. | 210/321.84 |
| 6,069,392 A | * | 5/2000 | Tai et al. | 257/419 |
| 6,146,543 A | * | 11/2000 | Tai et al. | 216/2 |
| 6,194,722 B1 | * | 2/2001 | Fiorini et al. | 250/338.1 |
| 6,262,421 B1 | * | 7/2001 | Tran | 250/370.09 |
| 6,359,276 B1 | * | 3/2002 | Tu | 250/338.1 |
| 6,606,913 B1 | * | 8/2003 | Gianchandani | 73/777 |
| 2002/0115198 A1 | * | 8/2002 | Nerenberg et al. | 435/287.2 |

OTHER PUBLICATIONS

Wen–Hwa Chu; Ferrari, M.; "Silicon Nanofilter with Absolute Pore Size and High Mechanical Strength"; 1995; SPIE–Int. Soc. Opt. Eng., vol. 2593, p. 9–20.

G. Kittisland; G. Stemme; "A Sub–micron Particle Filter in Silicon"; 1990; Sensors and Actuators, A21–A23, pp. 904–907.

S. Sugiyama, T. Suzuki, K. Kawahata, K. Shimaoka, M. Takigawa, and I. Igarashi, "Micro–diaphragm Pressure Sensor," Proc. IEEE International Electron Devices Mtg., Los Angeles, CA, Dec. 7–10 1986, pp. 184–187.

C.H. Mastrangelo and R.S. Muller, "Vacuum–sealed Silicon Micromachined Incandescent Light Source," Proc. IEEE International Electron Devices Mtg., San Francisco, CA, Dec. 3–6, 1989, pp. 503–506.

M.W. Judy and R. T. Howe, "Polysilicon Hollow Beam Lateral Resonators," Proc. Of the IEEE Micro Electro Mechanical Systems Workshop, Ft. Lauderdale, FL, Feb. 1–10, 1993, pp. 265–271.

(List continued on next page.)

Primary Examiner—Matthew Smith
Assistant Examiner—Renzo Rocchegiani
(74) Attorney, Agent, or Firm—Beyer Weaver & Thomas, LLP.

(57) ABSTRACT

A membrane structure comprising a silicon film having a grain structure including grains defining pores therebetween.

14 Claims, 7 Drawing Sheets

OTHER PUBLICATIONS

K.S. Lebouitz, R.T. Howe, and A.P. Pisano, "Permeable Polysilicon Etch–Access Windows for Microshell Fabrication," Proc. Of the $8^{th}$ International Conference on Solid–State Sensors and Actuators (Transducers '95), IEEE Stockholm, Sweden, Jun. 25–29, 1995, vol. 1, pp. 224–227.

K. S. Lebouitz, A. Mazaheri, R.T. Howe and A.P. Pisano, "Vacuum Encapsulation of Resonant Devices Using Permeable Polysilicon," Proc. $12^{th}$ International IEEE Conference on Micro Electro Mechanical Systems (MEMS '99), Orlando, FL, pp. 470–475.

Y. Kageyama, T. Tsuchiya, H. Funabashi, and J. Sakata, "Resonating Micro Structures in Microshells with HF Permeable Polycrystalline Silicon and Vacuum Sealing Thin Films," Proc. Of the $10^{th}$ International Conference on Solid–State Sensors and Actuators (Transducers '99), IEEE, pp. 340–343.

M. Chonko, D. Vandenberg, and D. Keitz, "The Integrity of Very Thin Silicon Films Deposited on $SiO_2$," in The Physics and Chemistry of $SiO_2$ and the $Si–SiO_2$ Interface 2; C.R. Helms and B.E. Deal, eds. Plenum, New York, 1993, pp. 357–362.

R. I. Hedge, M.A. Chonko and P.J. Tobin, "Microstructure and Integrity of Thin Silicon Films on $SiO_2$ After Immersion on 10:1 Buffered HF," Amorphous Silicon Technology, Materials Research Society Proc. vol. 297, Apr. 13–16, 1993, pp. 1037–1042.

D. J. Monk, P. Krulevitch, R.T. Howe, and G.C. Johnson, "Stress–Corrosion Cracking and Blistering of Thin Polycrystalline Silicon Films in Hydrofluoric Acid," Thin Films: Stresses and Mechanical Properties, Materials Research Society Proc. vol. 308, Apr. 12–16, 1993, pp. 641–646.

J. Zahn, D. Trebotich and D. Liepmann, "Microfabricated Microdialysis Microneedles for Continuous Medical Monitoring," Proc. First Annual IEEE–EMBS Conf. On Microtech. In Med. And Biology, Oct. 12–14, 2000, Lyon, France, pp. 375–380.

V.K. Mathews, "Effect of Processing Conditions on the Surface Morphology of Thin Polysilicon Films Used for DRAM Cell Capacitors," Phase Transformation Kinetics in Thin Films, Materials Research Society Proc. vol. 230, 1992, pp. 207–212.

H. Watanabe, N. Aoto, S. Adachi, and T. Kikkawa, "Device Application and Structure Observation for Hemispherical–grained Si," J. Appl. Phys. 71, No. 7, Apr. 1, 1992, pp. 3538–3543.

H. Watanabe, A. Sakai, T. Tatsumi, and T. Niino, "Hemispherical Grain Silicon for High Density DRAMS," Solid State Technology, Jul. 1992, pp. 29–33.

E.G. Lee and S.K. Rha, "A Study of the Morphology and Microstructure of LPCVD Polysilicon," J. of Materials Sci. vol. 28, 1993, pp. 6279–6284.

A. Banerjee, R. L. Wise, D.L. Crenshaw, R.B. Khamankar, and H. Edwards, "Evolution of Texture and Microstructure in Rough Polycrystalline Silicon for Advanced DRAM Applications," Polycrystalline Thin Films—Structure, Texture, Properties and Applications, Materials Research Society Proc. vol. 472, 1997, pp. 433–8.

P. Krulevitch, R.T. Howe, G.C. Johnson, and J. Huang, "Stress in Updoped LPCVD Polycrystalline Silicon," Proc. Of the International Conference on Solid–State Sensors and Actuators (Transducers '91), IEEE, pp. 949–952.

P. Krulevitch, T.D. Nguyen, G.C. Johnson, R.T. Howe, H.R. Wenk, and R. Gronsky, "LCVD Polycrystalline Silicon Thin Films: The Evolution of Structure, Texture, and Stress," Evolution of Thin Film and Surface Microstructure, Materials Research Society Proc. vol. 202, 1991, pp. 167–172.

P. Krulevitch, G. C. Johnson, and R.T. Howe, "Stress and Microstructure in Phosphorous Doped Polycrystalline Silicon," Smart Materials Fabrication and Materials for Micro–Electro–Mechanical Systems, Materials Research Society Proc. vol. 276, 1992, pp. 79–84.

C. L. Yu, P.A. Flynn, S. H. Lee and J.C.Bravman, "Stress and Microstructural Evolution of LPCVD Polysilicon Thin Films During High Temperature Annealing," Thin Films—Structure and Morphology, Materials Research Society Proc. vol. 441, 1997, pp. 403–408.

G.L. Olson and J.A. Roth, "Kinetics of Solid Phase Recrystallization in Amorphous Silicon," Mat. Sci. Reports, vol. 3, No. 1, Jun. 1988 pp. 1–78.

* cited by examiner

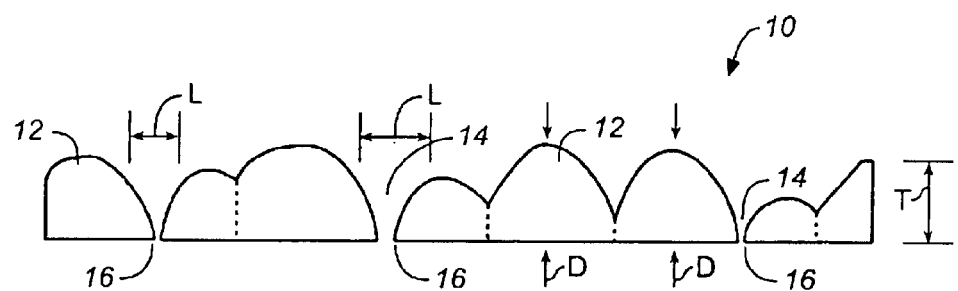
FIG._1
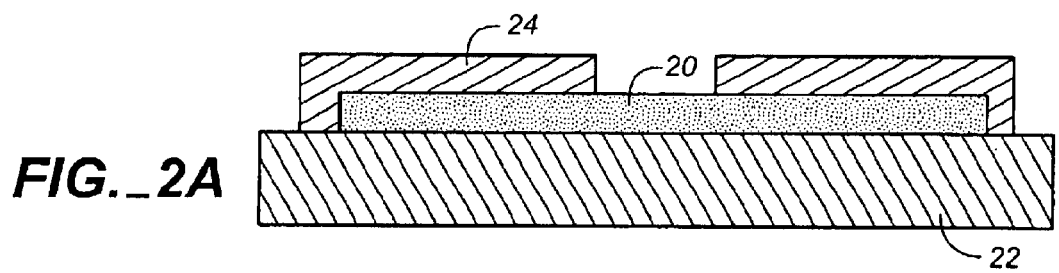
FIG._2A
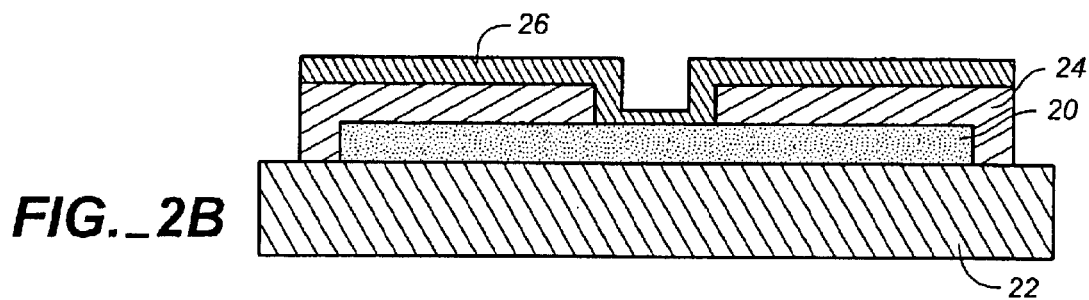
FIG._2B
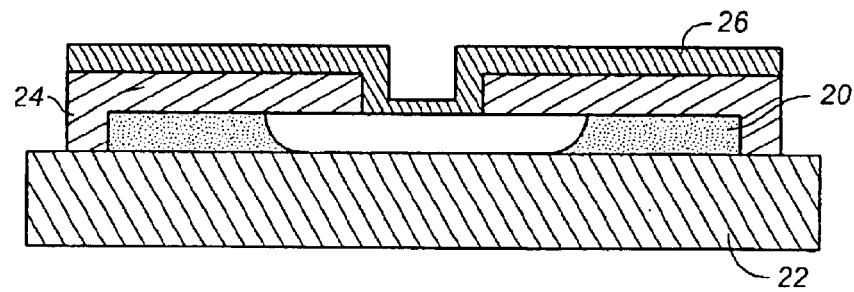
FIG._2C

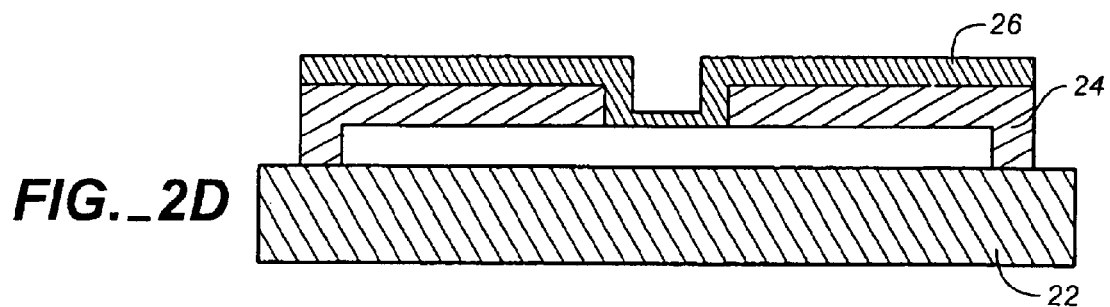
FIG._2D
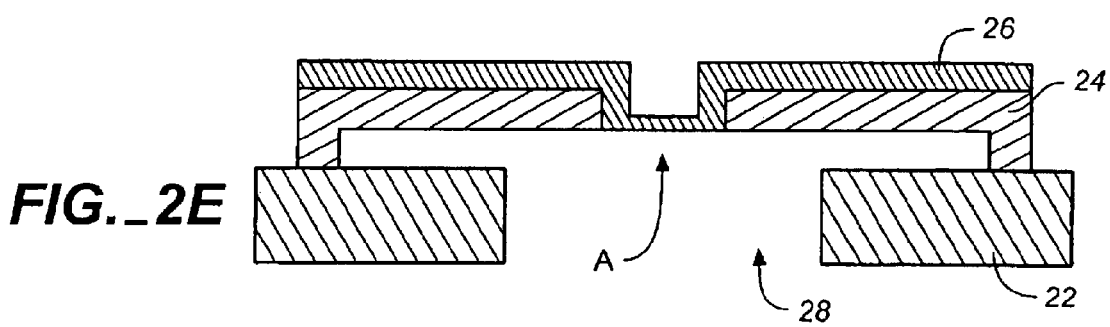
FIG._2E
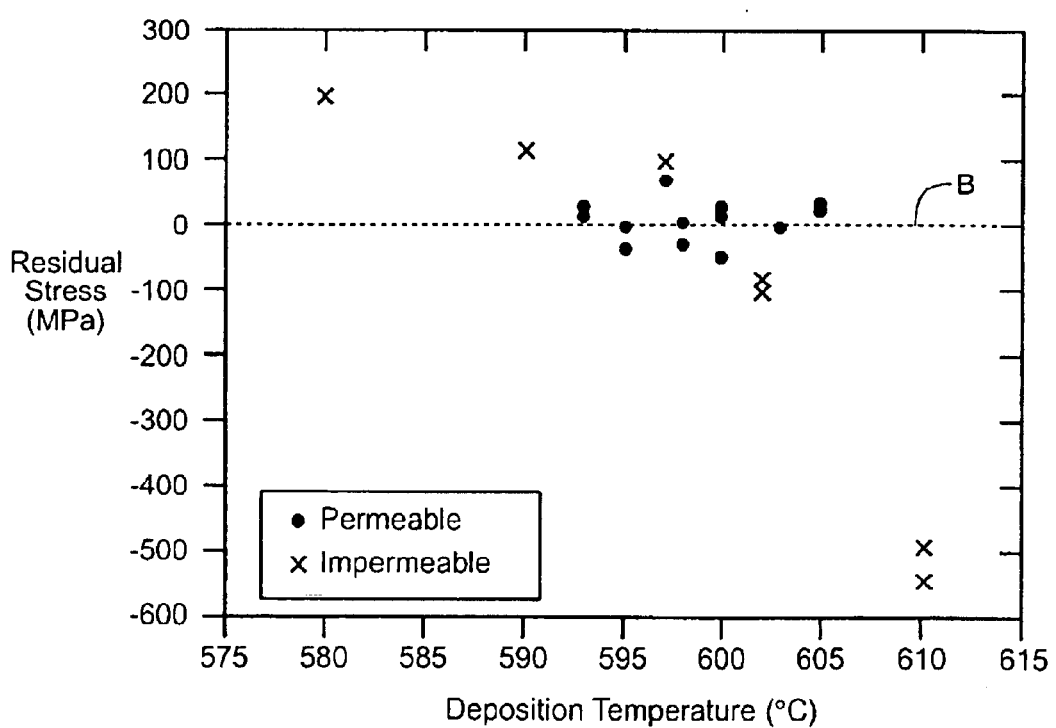
FIG._3

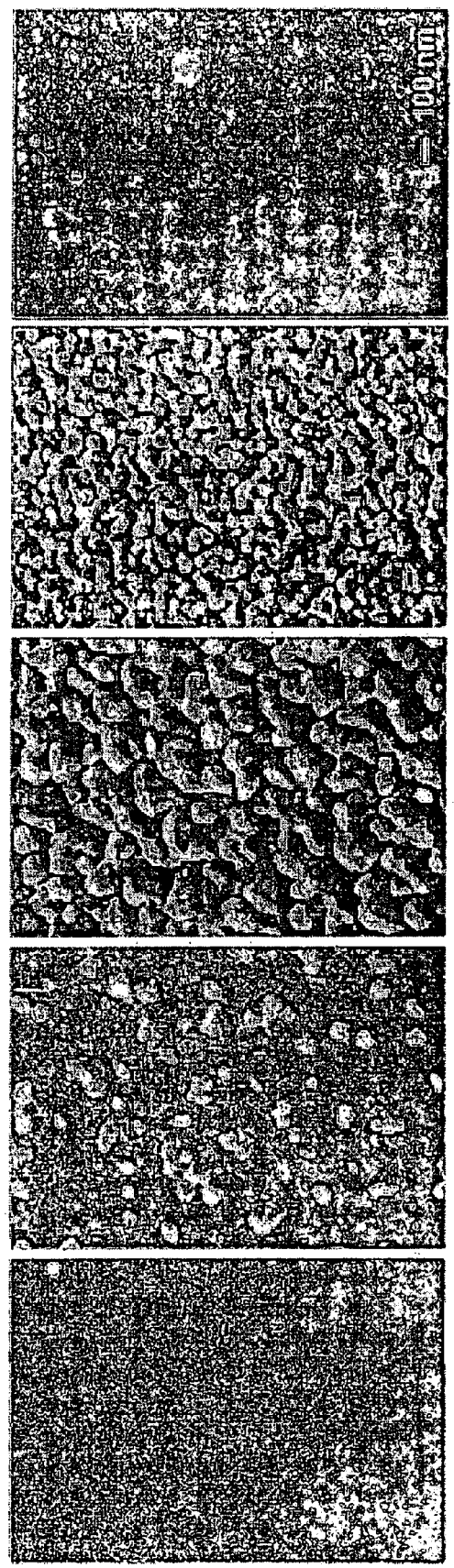
FIG._4A 590°C 114 MPa
FIG._4B 597°C 68 MPa
FIG._4C 600°C 12 MPa
FIG._4D 602°C -102 MPa
FIG._4E 610°C -490 MPa

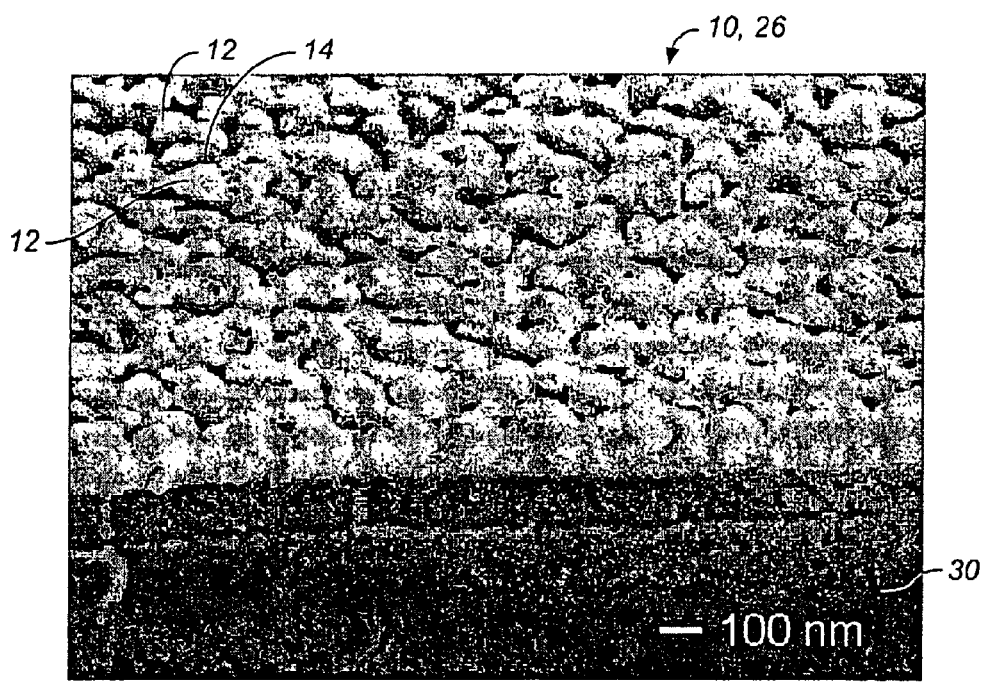
FIG._5
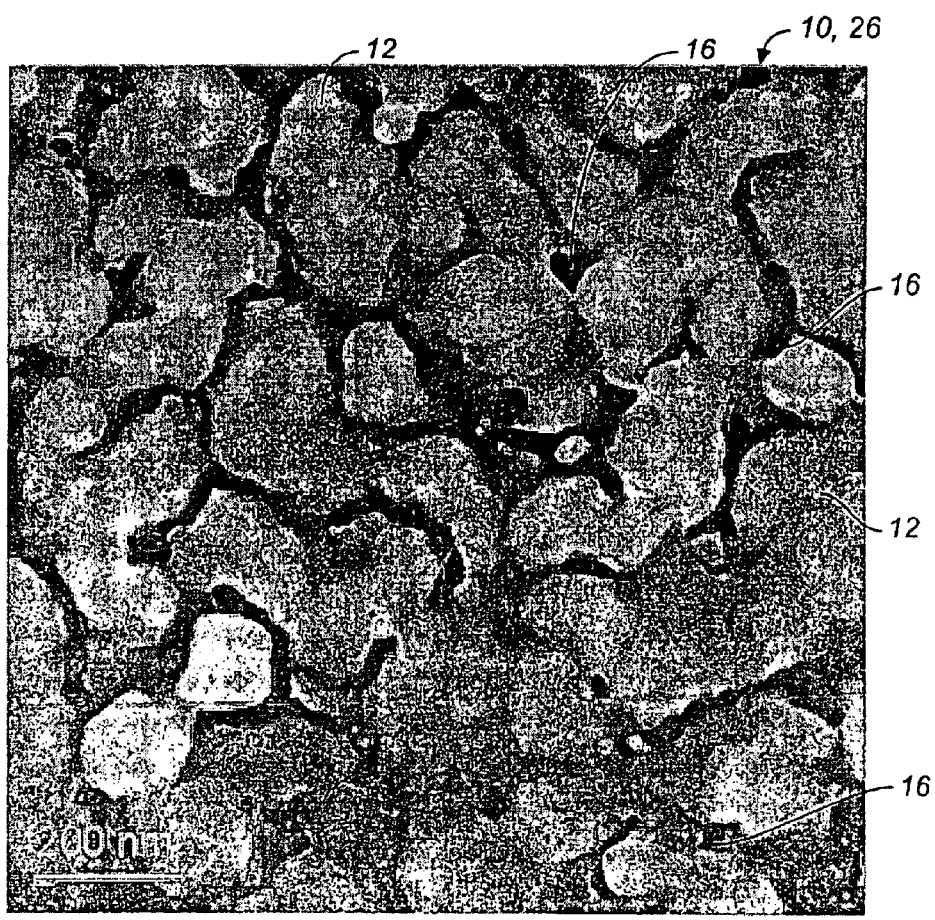
FIG._6

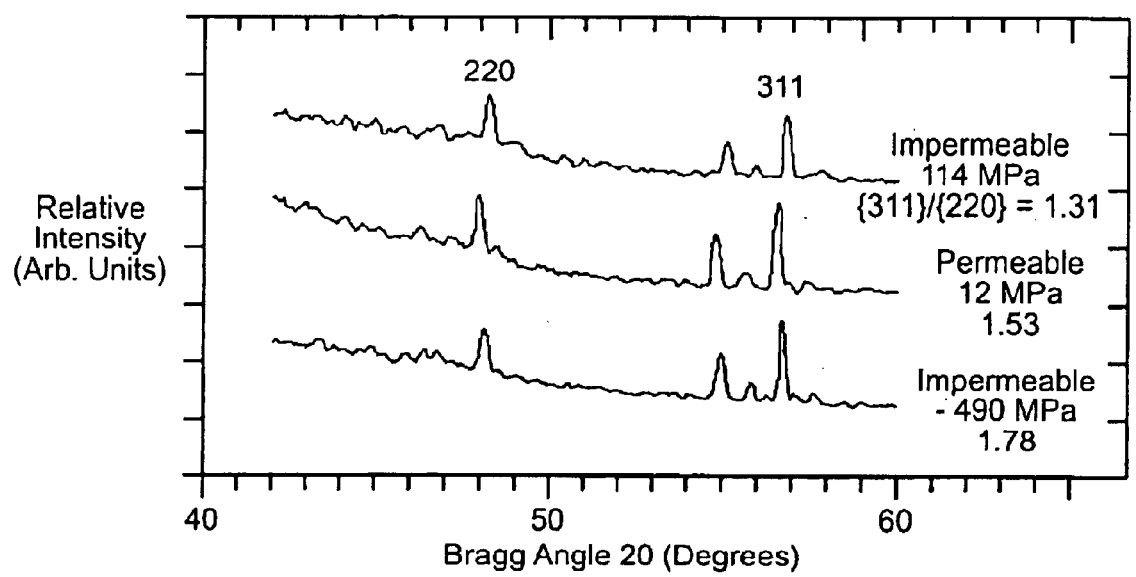
FIG._7
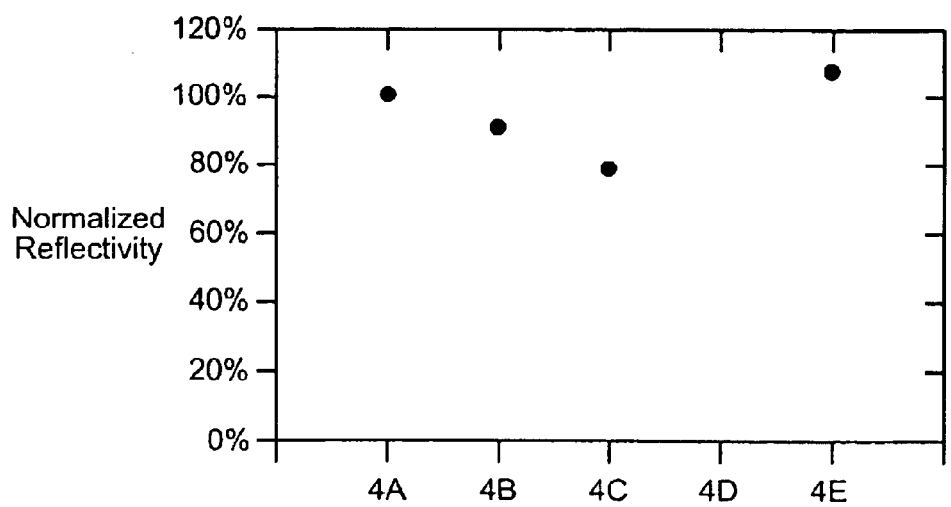
FIG._8

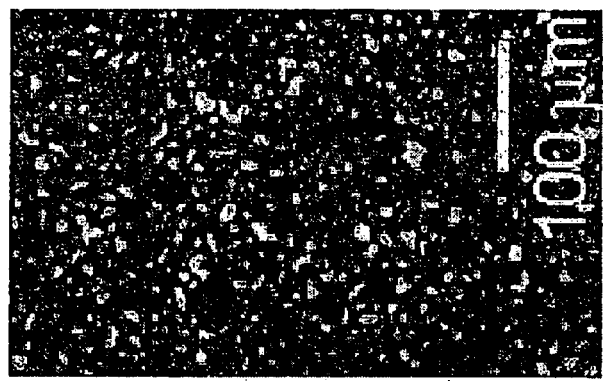
FIG._9D
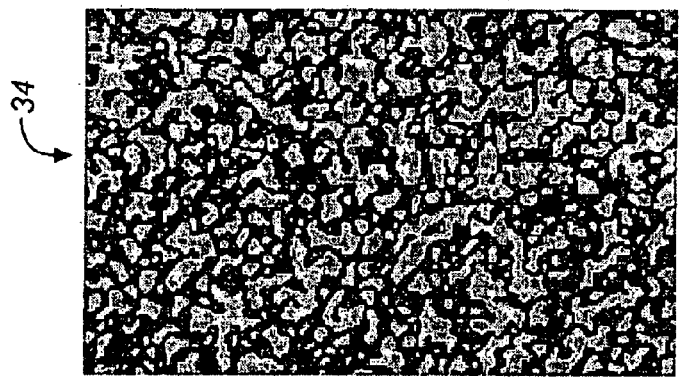
FIG._9C
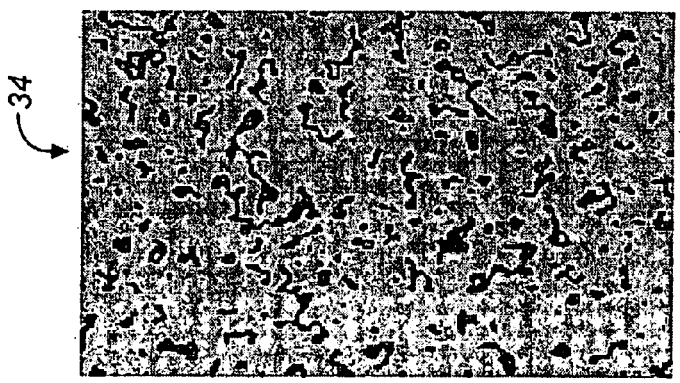
FIG._9B
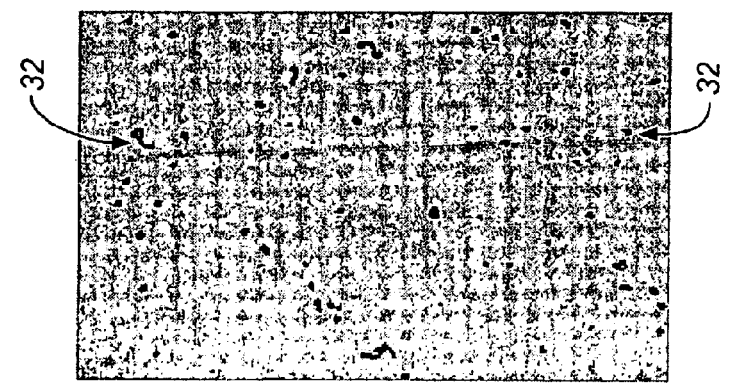
FIG._9A

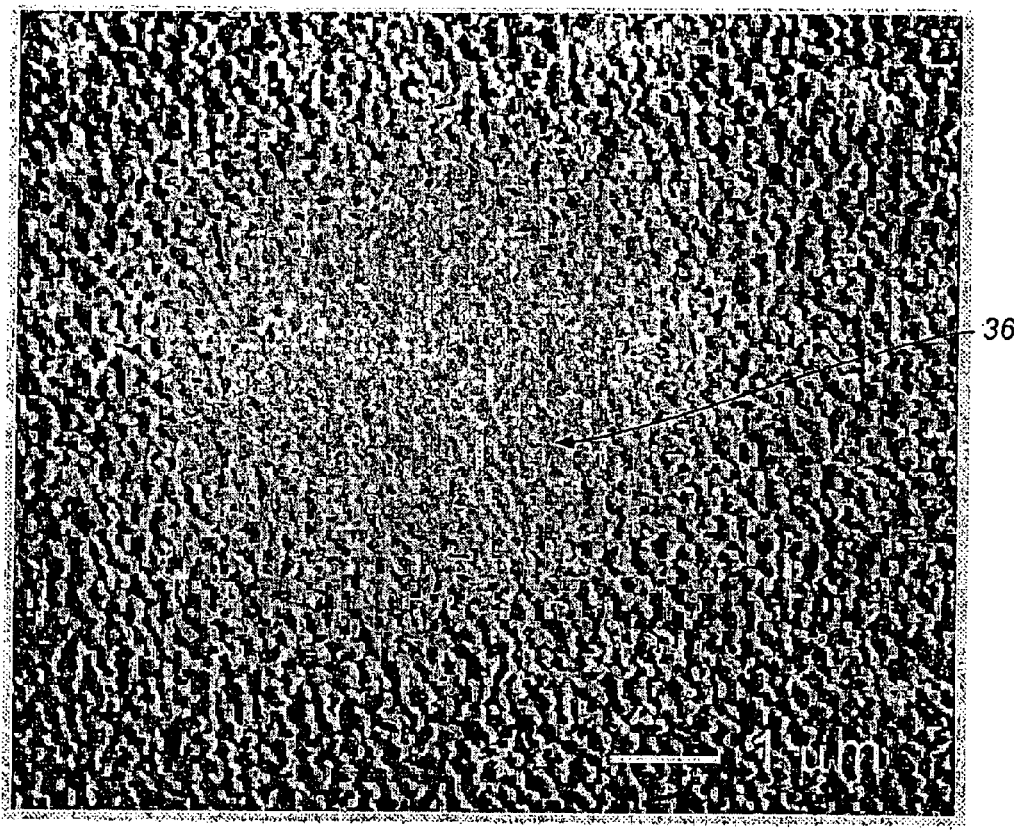
FIG._10
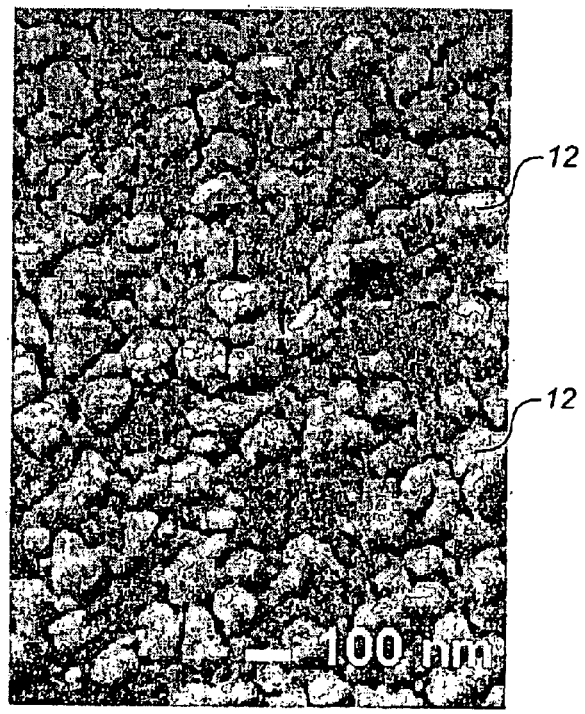
FIG._11

METHOD FOR PRODUCING A POROUS SILICON FILM

FIELD OF THE INVENTION

The present invention relates generally to microelectromechanical systems (MEMS), and more particularly to a thin film membrane structure and methods of making such membranes.

BACKGROUND

Developers of microelectromechanical systems (MEMS) often wish to produce device designs that require the fabrication of completely closed hollow structures. These hollow structures are difficult to realize using traditional micromachining processes, because in order to create a hollow cavity by the removal of a sacrificial layer, access holes must be left by which an etchant can reach the sacrificial material. If these holes are not to compromise the structure, they must be placed far apart, making it necessary to etch for a long time to remove the sacrificial material.

For structures such as sealed vacuum cavities and immersible ultrasonic transducers, these etch holes must be sealed by a subsequent material deposition. This requirement precludes the use of standard etch windows, instead requiring the fabrication of very thin slits that can be more readily sealed. This complicates the fabrication process and places restrictions on the device design. The sealing deposition itself can deposit unwanted material inside the hollow spaces, degrading internal structures.

It is known that thin layers of polycrystalline silicon (polysilicon) can sometimes be permeable to hydrogen fluoride (HF) etching solutions, raising the possibility of simply removing a sacrificial oxide layer through a layer of overlying polysilicon. The use of permeable polysilicon etch windows have been useful in creating hollow vacuum cavities. The HF resistance of thin polysilicon films used for MOSFET gates has also been investigated. Some studies have been done to determine the process conditions required to obtain permeable polysilicon films, and to examine the microstructure of some permeable films.

Unfortunately, MEMS researchers attempting to use permeable polysilicon have had difficulty obtaining repeatable results. The recipes used heretofore vary widely, and often yield impermeable films. A particular recipe may work at certain times and not at others. Further, the physical origin of the film permeability has remained unclear. If the processing of permeable polysilicon films were better understood, the use of such films could greatly simplify complicated process flows and new device designs might become practical.

SUMMARY

In one aspect, the invention features a membrane structure comprising a silicon film having a grain structure including grains defining pores therebetween.

In another aspect, the invention is directed to a membrane structure comprising a silicon film including grains having gaps formed therebetween to define individual pores. The maximum cross-sectional dimension of any one grain is approximately equal to the thickness of the film.

Various implementations of the invention may include one or more of the following features. The lateral dimension of any pore is less than that of any grain. The lateral dimension of the pores is between about 10 and 50 nanometers (nm). The thickness of the film is less than or equal to about 150 nm. The thickness of the film is between about 50 and 150 nm. The roughness of the film is approximately equal to its thickness. The film forms a filter. The film is conformal to an underlying surface. A structural layer is provided to support the film. A conformal layer is formed on the film to provide a selected chemical or biological function.

In yet another aspect, the invention is directed to a membrane filter structure comprising a silicon film having a grain structure including grains defining pores therebetween. A lateral dimension of the pores is between about 10 and 50 nm and the maximum diameter of any one grain does not exceed the thickness of the film.

In still another aspect, the invention features a method of fabricating a membrane structure. The method comprises forming a sacrificial layer over a first surface of a substrate and forming a silicon layer over the sacrificial layer. The silicon layer is formed such that it has a grain structure including grains defining pores therebetween wherein the maximum diameter of any one grain does not exceed the thickness of the membrane structure. The sacrificial layer is removed.

Various implementations of the invention may include one or more of the following features. The method may further include forming a passageway through the substrate. A conformal layer may be formed over the silicon layer to provide a selected chemical or biological function.

In still another aspect, the invention is directed to a method of fabricating a membrane structure comprising forming a sacrificial layer over a surface of a substrate. A structural layer is formed over the sacrificial layer and a silicon layer is formed over the structural layer. The silicon layer is formed such that it has a grain structure including grains defining pores therebetween wherein the maximum diameter of any one grain does not exceed the thickness of the membrane structure. The sacrificial layer is removed.

In yet another aspect, the invention features a method of fabricating a membrane filter structure. The method comprises forming a sacrificial layer over a first surface of a substrate. A silicon film is grown over the sacrificial layer at a temperature near the tensile-to-compressive transition temperature of the film such that the silicon film has a grain structure including grains defining pores therebetween wherein the maximum diameter of any one grain does not exceed the thickness of the membrane filter structure. The sacrificial layer is removed.

Various implementations of the invention may include one or more of the following features. The silicon film is formed under a near zero-stress condition. The silicon film has a residual stress within the range of about −50 to 50 mega-Pascals or between about −100 to 100 mega-Pascals. The silicon film is grown such that a lateral dimension of any pore is less than that of any grain. The silicon film is grown such that a lateral dimension of the pores is between about 10 and 50 nm. The silicon film is grown such that the thickness of the film is between about 50 and 150 nm. The silicon film is grown such that a roughness of the film is approximately equal to its thickness. The method may further include forming a conformal layer on the silicon film to provide a selected chemical or biological function. The method may also include monitoring the residual stress of the silicon film.

An advantage of the invention is that it provides a single step method for making a thin film filter membrane. The filter membrane contains nanoscale pores that allow gases, liquids and dissolved molecules to pass though the membrane while preventing a larger species from passing. The pores form as a result of the controlled grain structure of the membrane and no additional processing is required to form the pores. Removal of underlying material is easily achieved by immersing in an etching solution, or by other well-known etching techniques, yielding a free-standing membrane structure.

The details of one or more embodiments of the invention are set forth in the accompanying drawings and in the description below. Other features, objects and advantages of the invention will be apparent from the description and drawings, and from the claims.

DESCRIPTION OF DRAWINGS

FIG. 1 is a schematic, cross-sectional view of a membrane structure in accordance with the present invention.

FIGS. 2A–2E are schematic, cross-sectional views of various stages in the fabrication of the structure of FIG. 1.

FIG. 3 is a plot of residual stress versus deposition temperature for various films.

FIGS. 4A–4E are scanning electron microscope (SEM) micrographs of various films across the temperature range of 590–610° Centigrade (C.).

FIG. 5 is a cross-sectional SEM micrograph of the film shown in FIG. 4C.

FIG. 6 is a plan view, low-voltage SEM micrograph of the film shown in FIG. 4C.

FIG. 7 is a plot of X-ray diffraction data for the films shown in FIGS. 4A, 4C and 4E.

FIG. 8 is a plot of reflectometry data for the films shown in FIGS. 4A, 4B, 4C and 4E. (No data is shown for the film of FIG. 4D as no fuzed quartz wafer was included for that deposition.)

FIGS. 9A–9D are a series of SEM micrographs of the same permeable film exposed to hydrogen fluoride for increasing periods of time.

FIG. 10 is a SEM micrograph of a representative early clearing area as seen in FIGS. 9A–9B.

FIG. 11 is a SEM micrograph of the film of FIG. 4B after a two-hour annealing at 600° C.

Like reference symbols and reference numbers in the various drawings indicate like elements.

DETAILED DESCRIPTION

The present invention is directed to a thin film membrane structure and methods of making such membranes. The structure may be used as a filter. The present invention will be described in terms of several representative embodiments and methods. As discussed, the membrane of the present invention may be made of polycrystalline silicon. Alternatively, the membrane may be formed by depositing a silicon film in an initially amorphous state and then annealing the film to develop large silicon grains.

As shown in FIG. 1, a membrane structure 10 may be composed of polycrystalline silicon having a surface roughness approximately equal to a membrane thickness "T". The membrane is made up of silicon grains 12 of a cross-sectional dimension or diameter "D" approximately equal to the membrane thickness "T". The film thickness "T" can be between about 50 and 150 nanometers (nm). The silicon grains are separated by grooves or gaps 14 that form pores 16. The pores lead completely through the membrane, and they are found at the bottom of the gaps. The pores 16 have lateral dimensions "L" that are smaller than those of the silicon grains. A typical pore cross-sectional dimension "L" is on the order of 10–50 nm.

An essential aspect of the filter membrane 10 is that the pores 16 are self-assembled during the formation process of the film. There is no lithographic patterning or etching required to define the pores. No electrochemical process, or any other material removal process, is required. The pores form as a consequence of the control of the film growth process. As a result, the filter membrane 10 is much more simple and economical to produce than previously existing configurations.

As shown in FIGS. 2A–2D, the filter membrane structure 10 may be fabricated by growing a sacrificial support layer 20 on a substrate 22. The sacrificial layer 20 may be a thermally grown layer of silicon dioxide ($SiO_2$). The substrate 22 may be a 4-inch (100) silicon wafer. Other substrates, of course, could be used, for example a fused quartz wafer. An optional structural layer 24, such as a layer of silicon or silicon nitride, may be deposited above the sacrificial layer 20. The optional structural layer 24 provides additional structural rigidity after the filter membrane is released from the substrate. In this case, a portion of the filter membrane is supported by the optional structural layer 24 (FIG. 2A).

Next, as shown in FIG. 2B, a polysilicon thin film 26 can be deposited over the sacrificial support layer 20 and the optional structural layer 24. By way of example, a film 26 may be deposited using a low pressure chemical vapor deposition (LPCVD) system. The film may be deposited by flowing 125 standard cubic centimeters per meter (sccm) of pure silane ($SiH_4$) at a pressure of about 550 mTorr. The deposition temperature may be about 600° Celsius (C.). The deposition rate and the deposition time may be selected such that the film 26 is no thicker than about 150 nm.

The polysilicon film 26 may also be deposited using a disilane gas source. Additionally, the film may be deposited at various pressures between about 150 mTorr and 1 Torr. Reducing the deposition pressure will lower the growth temperature. The deposition temperature may also range between about 580–610°. Additionally, the flow rate of the deposition gas should be sufficient to maintain the deposition pressure, and prevent buildup of reaction products in the deposition chamber. The flow rate required for this will depend heavily on the size of the deposition hardware being used. Alternatively, various deposition processes other than LPCVD may be used to deposit the film 26. For example, a CVD or a plasma-enhanced CVD process may be used to form the film 26.

Next, as shown by FIG. 2C, the sacrificial support layer 20 may be removed by chemical etching through the pores of the filter membrane layer 26. For example, the support layer 20 may be etched using hydrogen fluoride (HF). Alternatively, other techniques, such as vapor-phase etching and plasma etching, may be used to remove the sacrificial support layer.

After the support layer has been removed, a free-standing thin film membrane 26 is formed as shown in FIG. 2D. The filter membrane 26 has the configuration and structure of the membrane 10 illustrated in FIG. 1. That is, the surface roughness of the filter membrane is approximately equal to the membrane thickness T. The film is made up of silicon grains of a cross-sectional dimension or diameter approximately equal to the membrane thickness. Certain of the silicon grains are separated by deep grooves or gaps. As discussed, pores that lead completely through the membrane structure are found at the bottom of these gaps. The pores have lateral dimensions that are smaller than those of the silicon grains, with typical pore diameters in the 10–50 nm range.

Finally, as shown in FIG. 2E, a passageway, channel or opening 28 may be formed through the back side of the substrate 22 for the passage of a fluid, as represented by arrow "A", to be filtered. The passageway 28 may be formed by, for example, etching or laser ablation.

A variation of the above-described method would be to deposit a conformal layer (not shown) onto the filter membrane 26. The thickness of the conformal layer would be selected such that the pores are not sealed. The conformal layer can provide increased structural strength. It can also be used to tailor the chemical or biological functionality of the membrane filter structure. For example, the surface characteristic of the membrane structure can be modified to provide a certain biological selectivity to the structure. The conformal layer, for instance, may be a self-assembled mono (SAM) layer for biological applications or parylene for structural rigidity.

The simplest method of manufacturing the thin film filter membrane 10, 26 is to control the deposition parameters of a single LPCVD process, such that the silicon film is deposited at a temperature that results in a film that is nearly free of intrinsic residual stress. At such conditions, the film takes on the required structure. The specific depositions parameters, as noted, will vary depending on the silicon source gas and the deposition pressure and temperature chosen. When the structure 10, 26 is deposited by LPCVD, it is highly conformal to an underlying surface, which is a valuable quality not available with approaches used in the past.

In a series of experiments, a total of 22 undoped polysilicon films were deposited at different temperatures across the temperature range of 590–610° C. The deposition rates were in the range of 10 nm per minute, at a deposition temperature of ten minutes for all films.

Polysilicon thin films were deposited using a front-injection, horizontal, hot-wall LPCVD system (Tystar Titan II). A pure $SiH_4$ atmosphere was used, at a pressure of 550 mTorr, and the deposition temperature was varied over the range of 590–610° C. The silane flow rate was 125 sccm. The substrates were 4-inch (100) silicon wafers with 100 nm of thermally gown $SiO_2$. In addition, for some runs, fuzed quartz wafers were also included as substrates to aid in film characterization. Because extremely thin films may not have the mechanical strength required for MEMS applications, and because a reduction in permeability has been observed for films grown beyond about 150 nm of film thickness, a target thickness of 100 nm was chosen.

The thickness of the deposited films was measured by spectroscopic interferometry using a Nanospec 3000 optical film thickness measurement system. The residual stress was determined by wafer curvature measured by laser scanning using a Tencor FLX-2320 instrument.

Permeability was judged by immersing each wafer in 49% HF solution. The combination of the thin polysilicon film atop a thin $SiO_2$ sacrificial layer gave the as-deposited wafers a bright golden appearance due to optical interference. If the underlying SiO2 was removed by the HF etchant, the color changed from bright gold to dull gray and could easily be judged by the naked eye. In some cases, the wafers were removed from the etchant when only partially cleared, so that the details of this behavior could be examined by optical microscopy.

Selected films were characterized by X-ray diffraction (XRD) using a Siemens D5000 diffractometer. Surface morphology was examined using a JEOL 6300 scanning electron microscope (SEM), in most cases using a 15 nm layer of sputtered gold to provide improved surface resolution. Spectroscopic reflectometry using the Nanospec 3000, as well as atomic force microscopy (AFM) were also performed on selected films.

For practical purposes, HF permeability was defined as substantial visible $SiO_2$ removal within one minute of immersion in the HF etchant. In general, films were clearly either permeable or impermeable; either there was widespread change in the color of the wafer in under a minute, or there was no color change even after several minutes. No effort was made to investigate long-term permeability of the qualitatively impermeable films, since those films are not likely to be practically useful.

FIG. 3 is a plot of the residual stress versus deposition temperature for all of the films, with an indication of whether each film was permeable. It is clear that all the permeable films are found within a well-defined process window located at the transition between tensile and compressive regimes (horizontal line "B"). In a few cases, impermeable films near the high temperature edge of this window showed small regions of permeability near the places where the wafer contacted the slots of the boat in the LPCVD tube. At these places, the films were thinner than usual.

SEM micrographs of selected films across the temperature range are shown in FIGS. 4A–4E. It is clear that a pronounced morphological change is seen near the zero-stress condition corresponding to the process window for the permeable films. The film deposited at the center of the process window (FIG. 4C) is characterized by large 100–200 nm grains which are nearly hemispherical in shape. The roughness of this film is comparable to the film thickness, and small gaps, 10 or 20 nm in size, appear to exist between many of the grains. The somewhat more compressive film deposited at higher temperature (FIG. 4D) shows a similar structure, but with a much smaller grain size that is significantly less than the film thickness. The slightly more tensile film shown in FIG. 4B shows a distinctive morphology of a few large grains protruding through a smooth surface layer. Of the films shown, those in FIGS. 4B, 4C and 4D were found to be permeable.

FIG. 5 is a cross-sectional SEM micrograph of the film shown in FIG. 4C. It is possible to see open boundaries 14 between adjacent grains 12 that extend all the way to the underlying layer 30, which is the layer of 100 nm $SiO_2$.

FIG. 6 is a higher magnification, low voltage SEM (LVSEM) micrograph of the same film. Pores 16 leading through the film are clearly visible. The smallest are about 10 nm in size, and the largest are about 50 nm.

The films shown in FIGS. 4A, 4C and 4E were used to obtain the X-ray diffraction data shown in FIG. 7. The diffraction patterns for all three films are very similar, showing a {311} and {220} texture. The selected 2-theta range is shown in order to emphasize the only difference between the three patterns: the integrated intensity of the {220} peak increases relative to the {311} peak as the deposition temperature is increased and the films become more compressive.

Spectroscopic reflectometry data was obtained using the films deposited on quartz substrates, since the optical effects of the $SiO_2$ layer and associated interfaces prevented the collection of good data from the films deposited on silicon wafers. Data was taken at wavelengths of 436, 640 and 780 nm, and only the data at 436 nm showed any overall pattern. The 436 nm data is shown in FIG. 8. In light of the SEM results, it is clear that only short wavelengths close to the 100–200 nm grain size are likely to distinguish between the surface morphologies of these films. The roughest film displays the lowest reflectivity.

Partially HF-cleared permeable films demonstrated a distinctive pattern when inspected using optical microscopy. A series of micrographs of the same permeable film exposed to HF for increasing periods of time in shown in FIGS. 9A–9D. These figures show the clearing behavior of an underlying 100 nm $SiO_2$ layer during 40 seconds exposure to a 49% HF solution. The dark color indicates regions where the underlying $SiO_2$ has been etched away. The $SiO_2$ film is removed first at discrete locations 32 (see FIG. 9A). With increasing time, the number of these locations increases (FIGS. 9B and 9C), and the cleared areas expand asymmetrically to form a complex network 34. Ultimately, the remaining $SiO_2$ is removed and the entire film is cleared (FIG. 9D).

Based on this observation, additional SEM study was performed in order to determine if the initial discrete areas were morphologically different from the rest of the film. FIG. 10 shows a representative example of these areas, and nothing different about the morphology is apparent. The whitish glow 36 is a charge effect due to the underlying cavity formed by the removal of the sacrificial layer. No anomaly in the grain structure is seen in this area.

In order to gain further understanding of the structural evolution of these films, an additional test was performed. A sample of the slightly tensile film of FIG. 4B was annealed under nitrogen at 600° C. for 2 hours. The result is shown in FIG. 11. Clearly much of the smooth layer has been transformed into large grains 12.

The experimental results indicate that the permeability of the films is due to the small gaps that exist between the approximately hemispherical grains unique to films grown near the tensile-to-compressive transition temperature. These gaps form pores continuous to the substrate only when the film thickness is comparable to or less than the diameter of the hemispherical grains. Continuous pores can also be found between pairs of large grains, or between large grains and the surrounding smooth surface, in the slightly tensile films.

Another important observation is that, at least for films of the thicknesses used in the experiments, the process window for permeability is narrow, only about 5–10° C. It is expected that using thinner films may widen the process window. However, device work done using permeable polysilicon suggests that freestanding permeable polysilicon films are fragile, and that thinner films may lack the mechanical integrity to survive the removal of the sacrificial layer without breakage. The narrowness of the process window seems to be the fundamental source of the repeatability problems.

By examining FIG. 3, it is evident that the residual stress is the best indicator of permeability. Regardless of deposition temperature, any film with a residual stress within the range of about −50 to 50 mega-Pascals (MPa) proved to be permeable. Thinner films are permeable if their residual stress is between about −100 and 100 MPa. Other techniques such as reflectometry may be useful, but the residual stress seems the most reliable indicator, and offers the best correlation with the film morphology.

In addition, the data of FIG. 3 show that even within the temperature range that produced permeable films, impermeable films sometimes resulted. A careful review of the process history reveals that these changes were the result of long-term variation on the order of several weeks, and often were separated by a period of equipment maintenance. Variations in actual tube temperature on the order of a few percent (versus the indicated temperature) can result from moving thermocouples, recalibrating temperature controls, or replacing key hardware. Depending on the temperature profile of the tube, a similar variation might result from placing substrates at different positions within the tube. In this study, the substrate wafers were always placed in similar locations.

Nonetheless, the permeability of the obtained films was quite producible over periods of a few days to a few weeks. It would be advisable, in cases where permeable polysilicon is deposited on a routine basis, to routinely monitor the residual film stress so that the process can be continuously tuned to produce films near the center of the process window. The process temperature should also be retuned after any instance of tube maintenance, using film residual stress as a guide.

Possible variations to the method of manufacturing the thin film membrane structure 10, 26 include depositing the film in an initially amorphous state and annealing it to develop large silicon grains, which might also form pores at their boundaries. It is also possible to deposit the silicon film at conditions that are slightly removed from the ideal conditions, for example, the films of FIGS. 4B and 4D. These structures possess the required grain structure and associated pores in some areas but not in others. However, they are still permeable overall. In the case of films that are at the tensile, low-temperature extreme of the process window for permeable films, the structure looks like the one in FIG. 4B. The structure does not look entirely like that diagrammed in FIG. 1, but there are local regions where there are clumps of grains that look like FIG. 1, possessing pores between them.

In summary, microfabricated membrane filter structures and methods of their fabrication have been described. The permeability of the filter structure 10, 26 is the result of small (order of 10–50 nm) pores between large (order of 100–200 nm) hemispherical grains that characterize the microstructure at the ideal process conditions. This microstructure occurs within a narrow (about 5–10° C.) process window at the transition between tensile and compressive film stress regimes.

Because the process window is so narrow, optimal recipes can vary based on temperature variation within the tube, gradual change of tube parameters over time, and especially as the result of tube maintenance. Presumably, there will appear to be significant variation between different models of CVD equipment as well.

Because the permeable microstructure is associated with very low-stress films, measuring the residual stress of the films provides a convenient and effective way of monitoring and controlling the permeability. Films of approximately 100 nm thickness are permeable if their residual stress is within the range of about 50 to −50 MPa. Residual stress measurements offer the surest way of tuning a particular system to produce permeable films repeatedly.

Due to the economy and ease of manufacture of the filter membrane, and the fact that it is manufactured as silicon using standard thin film deposition techniques, there are many applications in a wide range of MEMS systems and other precision devices. For instance, the filter membrane may be used for separation of biological fluids, for instance, the separation of plasma from whole blood. It may also be used to filter liquids or gases that contain entrained particles, or to form semipermeable membrane coverings for microsensors or other devices.

A number of embodiments of the invention have been described. Nevertheless, it will be understood that various modifications may be made without departing from the spirit and scope of the invention. Accordingly, other embodiments are within the scope of the following claims.

What is claimed is:

1. A method of fabricating a structure comprising:
    forming a sacrificial layer over a first surface of a substrate;
    forming a silicon layer over the sacrificial layer;
    removing the sacrificial layer; and
    controlling a residual stress of the silicon layer to insure that the silicon layer has a residual stress within a range of between about −50 to 50 mega-Pascals and a grain structure including grains defining pores therebetween wherein the grains have an approximately hemispherical shape.

2. The method of claim 1 further including forming a passageway through the substrate.

3. The method of claim 1 further including forming a conformal layer over the silicon layer to provide a selected chemical or biological function.

4. A method of fabricating a structure comprising:
    forming a sacrificial layer over a surface of a substrate;
    forming a structural layer over the sacrificial layer;
    forming a silicon layer over the structural layer;
    removing the sacrificial layer; and
    controlling the parameters of the silicon layer forming step to insure that the silicon layer has a residual stress within a range of between about −100 to 100 mega-Pascals and a grain structure including grains defining pores therebetween wherein the grains have an approximately hemispherical shape.

5. A method of fabricating a structure comprising:
    forming a sacrificial layer over a first surface of a substrate; and
    growing a silicon film over the sacrificial layer at a temperature near the tensile-to-compressive transition temperature of the silicon film, and controlling a residual stress of the silicon film such that the silicon film has a residual stress within a range of about −100 to 100 mega-Pascals and a grain structure including a layer of grains having an approximately hemispherical shape wherein pores are defined by gaps between adjacent grains.

6. The method of claim 5 wherein the silicon film is formed under a near zero-stress condition.

7. The method of claim 5 wherein the silicon film has a residual stress within a range of about −50 to 50 mega-Pascals.

8. The method of claim 5 wherein the silicon film is grown such that a lateral dimension of any pore is less than that of any grain.

9. The method of claim 5 wherein the silicon film is grown such that a lateral dimension of the pores is between about 10 and 50 nanometers.

10. The method of claim 5 wherein the silicon film is grown such that the thickness of the film is between about 50 and 150 nanometers.

11. The method of claim 5 wherein the silicon film is grown such that the roughness of the film is approximately equal to its thickness.

12. The method of claim 5 further including forming a conformal layer on the silicon film to provide a selected chemical or biological function.

13. The method of claim 5 wherein the silicon film is used to form a membrane filter structure.

14. A method of fabricating a structure comprising:
    forming a silicon layer over a first surface of a substrate; and
    controlling the parameters of the forming step to insure that the silicon layer has a residual stress within a range of between about −100 to 100 mega-Pascals and
    a grain structure including a single layer of grains of approximately hemispherical shape defining pores therebetween.

* * * * *